(12) United States Patent
Luke

(10) Patent No.: US 8,428,271 B1
(45) Date of Patent: Apr. 23, 2013

(54) BALANCED DISTORTION FOR MUSICAL INSTRUMENT

(76) Inventor: Charles Michael Luke, Cumming, GA (US)

( * ) Notice: Subject to any disclaimer, the term of this patent is extended or adjusted under 35 U.S.C. 154(b) by 381 days.

(21) Appl. No.: 12/726,760

(22) Filed: Mar. 18, 2010

Related U.S. Application Data

(60) Provisional application No. 61/162,014, filed on Mar. 20, 2009.

(51) Int. Cl.
*H03G 3/00* (2006.01)

(52) U.S. Cl.
USPC .......................................... 381/61; 381/118

(58) Field of Classification Search ............... 381/61, 381/118, 120
See application file for complete search history.

(56) References Cited

U.S. PATENT DOCUMENTS

| | | | | |
|---|---|---|---|---|
| 4,439,742 | A * | 3/1984 | Sondermeyer | 330/262 |
| 4,987,381 | A | 1/1991 | Butler | |
| 5,524,055 | A * | 6/1996 | Sondermeyer | 381/61 |
| 5,805,713 | A * | 9/1998 | Pritchard | 381/61 |
| 7,206,419 | B1 * | 4/2007 | Poletti | 381/98 |
| 2008/0049950 | A1 * | 2/2008 | Poletti | 381/94.2 |

OTHER PUBLICATIONS

"CMOS Linear Application", Jul. 1973; National Semiconductor.*
Bruce Carter, "Fully Differential Op Amps Made Easy", May 2002, Texas Instruments.*
"CMOS Hex Buffer/Converters"; May 1999; Texas Instruments.*
Anderton, Craig, project "Tube Sound Fuzz", in book "Electronic Projects for Musicians", 1975, Project # 24, p. 170.

* cited by examiner

*Primary Examiner* — Xu Mei
*Assistant Examiner* — David Ton
(74) *Attorney, Agent, or Firm* — Crose Law LLC; Bradley D. Crose

(57) ABSTRACT

A device is disclosed to provide balanced distortion in a musical instrument and to emulate the sound of a tube amplifier when overdriven. The device distorts, clips, and limits, selectively, an input audio signal. The circuit includes: an input stage to receive the input audio signal, remain linear, and maintain balanced outputs, and to split the input audio signal into an inverting, negative path and a non-inverting, positive path; an inverting, negative path balanced distortion circuit to receive an inverting, negative path input; a non-inverting, positive path balanced distortion circuit to receive a non-inverting, positive path input; and an output stage, wherein the output stage combines a pair of differential inputs to produce an output audio signal. The audio distortion circuit cancels incoming asymmetries in the output stage from the combined pair of differential inputs and produces the output audio signal as symmetric.

20 Claims, 16 Drawing Sheets

BALANCED DISTORTION FOR MUSICAL INSTRUMENT

CROSS-REFERENCE TO RELATED APPLICATION(S)

The present non-provisional patent application claims the benefit of priority of U.S. Provisional Patent Application No. 61/162,014, which is entitled "BALANCED DISTORTION FOR MUSICAL INSTRUMENT", which was filed on Mar. 20, 2009, and which is incorporated in full by reference herein.

FIELD OF THE INVENTION

The technology described herein relates generally to the processing of audio signals generated by electronic musical instruments such as, for example, guitars. More specifically, this technology relates to a circuit topology, device, and associated methods for musical instrument amplifiers adapted to provide balanced distortion in the musical instrument and to emulate the sound of a tube amplifier when overdriven.

BACKGROUND OF THE INVENTION

The distortion of audio signals for particular applications with musical instruments is known in the art. By way of example, the sound produced by the electric guitar is altered, in one aspect, dependent on the properties of the guitar amplifier. In one aspect, guitar amplifiers can be altered to emulate the sound produced by vacuum tube amplifiers, which were utilized when electric guitars were first developed.

Many musicians and audiophiles favor the sound produced by a vacuum tube amplifier. When a vacuum tube amplifier is overdriven, a warm distorted sound characteristic is produced with the presence of harmonics. Efforts have been made in the art to emulate that particular desired sound without using a vacuum tube amplifier.

By way of example, MOSFETs have been used to create tube amplifier distortion in the past. Craig Anderton, in "Electronic Projects for Musicians", 1975, Project number 24, on page 170, discloses a "Tube Sound Fuzz" based on the CD4049 CMOS Inverter IC. This disclosure is based on an unbalanced circuit topology.

A balanced circuit topology is used for the distortion, clipping, or limiting of the signal. It is difficult to find devices that will enter into clipping at the same level and at the same rate on both polarities of their waveform. For transistors and MOSFETs, it is difficult to find devices that behave the same way for saturation and cutoff. For complementary MOSFETs it is difficult to find devices that have the complementary matching required to find a saturation characteristic that behaves the same for both P and N type devices. Because of this, it is difficult to generate a waveform that has symmetry. Waveform asymmetry causes beat notes at low frequencies when multiple musical notes are played together. The beat note from multiple tones causes modulation of the DC component and creates intermodulation at low frequencies. These low frequency intermods are very unmusical and, therefore, undesirable. A symmetric waveform, because it has no DC component, does not create this intermodulation at DC. Because the distortion circuitry is balanced, it does not create this intermod. The technology described herein suppresses this type of distortion. This type of clean distortion is what makes this disclosed technology an improvement over the present prior art.

The circuit topology disclosed herein lends itself well to the matching of components by the use of integrated circuits. Because of the circuit topology, matched components are needed in the two balanced paths. With matched components there may be asymmetry in a single path, but there will be an equal and matched asymmetry in the parallel path as well. These two paths, when subtracted will form the average of the two asymmetries. If they are matched, the output will be completely symmetric. Amplifiers known in the prior art require complementary matching of components which is considerably more difficult to obtain. Amplifiers known in the prior art require MOSFETs in which the P channel device's transfer characteristic has to be exactly equal and opposite to that of the N channel device. For the topology disclosed herein, the P channel device has to match the other P channel device, and the N channel device has to match the other N channel device, but the P channel device does not have to match the opposite of the N channel device. Because of the ease of implementation, this is considered an improvement to the prior art.

The circuit topology disclosed herein can also include the use of clamp diodes on the input of the distortion circuit to create cross-over distortion which is also a characteristic of an over-driven tube power amplifier. These diodes are inherent in CMOS inverters. When these inverters are built from discrete devices, the diodes can be switched into the circuit or can be switched out of the circuit to give a variation in tone. This disclosure provides a novel method for the emulation of tube cross-over distortion.

The circuit disclosed herein allows for power supply voltage variation on the distortion elements. This allows for variation in tone from a hard distortion to a smooth overdrive.

Related patents and published patent applications known in the art include the following: U.S. Pat. No. 4,987,381 issued to Butler on Jan. 22, 1991, discloses a tube sound solid state amplifier. U.S. Pat. No. 5,524,055 issued to Sondermeyer on Jun. 4, 1996, discloses a solid state circuit for emulating tube compression effect. U.S. Patent Application Publication No. 2008/0049950 filed by Poletti and published on Feb. 28, 2008, discloses a nonlinear processor for audio signals.

The foregoing patent information reflects the state of the art of which the inventor is aware and is tendered with a view toward discharging the inventor's acknowledged duty of candor in disclosing information that may be pertinent to the patentability of the technology described herein. It is respectfully stipulated, however, that the foregoing patent and other information do not teach or render obvious, singly or when considered in combination, the inventor's claimed invention.

BRIEF SUMMARY OF THE INVENTION

In various exemplary embodiments, the technology described herein provides a circuit topology, device, and associated methods to provide balanced distortion in a musical instrument and to emulate the sound of a tube amplifier when overdriven. Because this is done at low signal levels, the distorted sound can be created at lower volume levels than what is normally required to saturate a tube power amplifier.

In one exemplary embodiment, the technology described herein provides an audio distortion circuit to provide balanced distortion in a musical instrument and to emulate the sound of a tube amplifier when overdriven. The audio distortion circuit includes: an input stage adapted to receive an input audio signal, remain linear, and maintain balanced outputs that are opposite in polarity, and adapted to split the input audio signal into two parallel signal paths, an inverting, negative path and a non-inverting, positive path; an inverting, negative path balanced distortion circuit following the inverting, negative path and adapted to receive an inverting, negative path input; a non-inverting, positive path balanced distortion circuit following the non-inverting, positive path, and parallel to the inverting, negative path balanced distortion circuit, and adapted to receive a non-inverting, positive path input; and an output stage following the inverting, negative path balanced distortion circuit and the non-inverting, positive path balanced distortion circuit, wherein the output stage is adapted to combine a pair of differential inputs, one an output negative path exited from the inverting, negative path balanced distortion circuit, and two an output positive path exited from the non-inverting, positive path balanced distortion circuit, to produce an output audio signal. These two paths are subtracted in the output circuitry.

The audio distortion circuit is adapted to cancel incoming asymmetries in the output stage from the combined pair of differential inputs and produce the output audio signal as symmetric.

The audio distortion circuit is adapted to distort, clip, and limit, selectively by a user, the input audio signal.

In various embodiments, the input stage is an amplifier with balanced outputs that are opposite in polarity. In various alternative embodiments, the input stage is a transformer with balanced outputs.

In various embodiments, the inverting, negative path balanced distortion circuit and the non-inverting, positive path balanced distortion circuit each include a CMOS inverter with an internal input protection diode.

In various alternative embodiments, the inverting, negative path balanced distortion circuit and the non-inverting, positive path balanced distortion circuit each includes a plurality of discrete components each adapted to emulate a CMOS inverter. Each plurality of discrete components can include a P channel MOSFET and an N channel MOSFET. Each plurality of discrete components can include a diode in each of the inverting, negative path balanced distortion circuit and the non-inverting, positive path balanced distortion circuit. The diode is adapted to be switched selectively into the circuit or switched selectively out of the circuit to provide a variation in tone.

A transfer characteristic of the P channel MOSFET is not required to be exactly equal and opposite, complimentarily matched, to a transfer characteristic of the N channel MOSFET.

In at least one embodiment, the output stage is an amplifier with differential input. The amplifier can be an opamp subtractor circuit that is adapted to remain linear and to produce an output equal to a difference of its two inputs. In at least one alternative embodiment, the output stage is a transformer, wherein the audio distortion circuit is thereby adapted to generate higher power output signals to make a solid-state power amplifier that simulates tube distortion.

In an alternative embodiment, the audio distortion circuit includes: a plurality of inverters on the inverting, negative path; a plurality of inverters on the non-inverting, positive path; and a plurality of local resistive dividers. Each local resistive divider is adapted to establish a feedback at each inverter. AC coupling selectively is established between the inverters.

In an alternative embodiment, the audio distortion circuit includes: a plurality of inverters on the inverting, negative path, the plurality being an odd number; a plurality of inverters on the non-inverting, positive path, the plurality being an odd number; a first local resistive divider on the inverting, negative path, wherein the first local resistive divider is adapted to provide feedback around all of the plurality of inverters on the inverting, negative path; and a second local resistive divider on the non-inverting, positive path, wherein the second local resistive divider is adapted to provide feedback around all of the plurality of inverters on the non-inverting, positive path.

In an alternative embodiment, the audio distortion circuit includes: a plurality of inverters on the inverting, negative path, the plurality being an even number; a plurality of inverters on the non-inverting, positive path, the plurality being an even number; a first feedback resistor, the first feedback resistor cross-coupled from an output of the last inverter of the plurality of inverters on the inverting, negative path to an input of a first inverter on the non-inverting, positive path; and a second feedback resistor, the second feedback resistor cross-coupled from an output of the last inverter of the plurality of inverters on the non-inverting, positive path to an input of a first inverter on the inverting, negative path. The first feedback resistor and the second feedback resistor are adapted to provide cross-coupled feedback.

In an alternative embodiment, the audio distortion circuit includes: an at least one first variable filter placed in a first feedback path on the non-inverting, positive path; and an at least one second variable filter placed in a second feedback path on the inverting, negative path. The variable filters are adapted to change selectively the frequency response of the feedback paths.

In an alternative embodiment, the audio distortion circuit includes: at least one first resistor placed between a first Vsupply and a power to the inverting, negative path balanced distortion circuit; and at least one second resistor placed between a second Vsupply and a power to the non-inverting, positive path balanced distortion circuit. The resistors are adapted to linearize a response. In an alternative embodiment, the audio distortion circuit includes: at least one first resistor placed between a chassis ground and a ground to the inverting, negative path balanced distortion circuit; and at least one second resistor placed between the chassis ground and a ground to the non-inverting, positive path balanced distortion circuit. The resistors are adapted to linearize a response.

In an alternative embodiment, the output stage includes a balanced drive into a speaker. The speaker is adapted for a high power combination of two balanced CMOS power amplifiers in a common output.

In another exemplary embodiment, the technology described herein provides an audio distortion circuit to provide balanced distortion in a musical instrument and to emulate the sound of a tube amplifier when overdriven. The audio distortion includes: an input stage amplifier with balanced outputs adapted to receive an input audio signal, remain linear, and maintain balanced outputs, and adapted to split the input audio signal into two parallel signal paths, an inverting, negative path and a non-inverting, positive path; an inverting, negative path balanced distortion circuit, comprising a first P channel MOSFET, a first N channel MOSFET, and a first diode, and following the inverting, negative path and adapted to receive an inverting, negative path input; a non-inverting, positive path balanced distortion circuit, comprising a second P channel MOSFET, a second N channel MOSFET, and a second diode, following the non-inverting, positive path, and parallel to the inverting, negative path balanced distortion circuit, and adapted to receive a non-inverting, positive path input; and an output stage amplifier with differential input following the inverting, negative path balanced distortion circuit and the non-inverting, positive path balanced distortion circuit, wherein the output stage amplifier with differential input is adapted to combine a pair of differential inputs, one an output negative path exited from the inverting, negative path balanced distortion circuit, and two an output positive path exited from the non-inverting, positive path balanced distortion circuit, to produce an output audio signal.

The first diode and the second diode each is adapted to be switched selectively into the circuit or switched selectively out of the circuit to provide a variation in tone.

A transfer characteristic of each of the P channel MOSFETs is not required to be exactly equal and opposite, complimentarily matched, to a transfer characteristic of the N channel MOSFET.

The audio distortion circuit is adapted to cancel incoming asymmetries in the output stage amplifier with differential input from the combined pair of differential inputs and produce the output audio signal as symmetric.

The audio distortion circuit is adapted to distort, clip, and limit, selectively by a user, the input audio signal.

In another exemplary embodiment, the technology described herein provides a method to provide balanced distortion in a musical instrument and to emulate the sound of a tube amplifier when overdriven. The method comprising: receiving an audio input signal at an input stage adapted to receive an input audio signal, while maintaining linearity and maintaining balanced outputs; splitting the input audio signal into two parallel signal paths, an inverting, negative path and a non-inverting, positive path; passing a first signal through an inverting, negative path balanced distortion circuit following the inverting, negative path and adapted to receive an inverting, negative path input; passing a second signal through a non-inverting, positive path balanced distortion circuit following the non-inverting, positive path, and parallel to the inverting, negative path balanced distortion circuit, and adapted to receive a non-inverting, positive path input; combining the first signal and the second signal in an output stage following the inverting, negative path balanced distortion circuit and the non-inverting, positive path balanced distortion circuit, wherein the output stage is adapted to combine a pair of differential inputs, one an output negative path exited from the inverting, negative path balanced distortion circuit, and two an output positive path exited from the non-inverting, positive path balanced distortion circuit, to produce an output audio signal; canceling incoming asymmetries and beat note modulation in the output stage from the combined pair of differential inputs; producing the output audio signal as symmetric; and distorting, clipping, and limiting, selectively by a user, the input audio signal.

The method also can include: utilizing an inverting, negative path balanced distortion circuit, comprising a first P channel MOSFET, a first N channel MOSFET, and a first diode, and following the inverting, negative path and adapted to receive an inverting, negative path input; utilizing a non-inverting, positive path balanced distortion circuit, comprising a second P channel MOSFET, a second N channel MOSFET, and a second diode, following the non-inverting, positive path, and parallel to the inverting, negative path balanced distortion circuit, and adapted to receive a non-inverting, positive path input; and switching, selectively, the first diode and the second diode into the circuit and out of the circuit to provide a variation in tone. A transfer characteristic of each of the P channel MOSFETs is not required to be exactly equal and opposite, complimentarily matched, to a transfer characteristic of the N channel MOSFET.

The method further can include: varying a first Vsupply to the inverting, negative path balanced distortion circuit; varying a second Vsupply to the non-inverting, positive path balanced distortion circuit; and producing, thereby, variation in tonal characteristics. These can be varied together with a common voltage or separately with independent voltages.

There has thus been outlined, rather broadly, the more important features of the technology in order that the detailed description thereof that follows may be better understood, and in order that the present contribution to the art may be better appreciated. There are additional features of the technology that will be described hereinafter and which will form the subject matter of the claims appended hereto. In this respect, before explaining at least one embodiment of the technology in detail, it is to be understood that the invention is not limited in its application to the details of construction and to the arrangements of the components set forth in the following description or illustrated in the drawings. The technology described herein is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the technology described herein.

Further objects and advantages of the technology described herein will be apparent from the following detailed description of a presently preferred embodiment which is illustrated schematically in the accompanying drawings.

BRIEF DESCRIPTION OF THE DRAWINGS

The technology described herein is illustrated with reference to the various drawings, in which like reference numbers denote like device components and/or method steps, respectively, and in which.

DETAILED DESCRIPTION OF THE INVENTION

Before describing the disclosed embodiments of this technology in detail, it is to be understood that the technology is not limited in its application to the details of the particular arrangement shown here since the technology described is capable of other embodiments. Also, the terminology used herein is for the purpose of description and not of limitation.

In various exemplary embodiments, the technology described herein provides a circuit topology, device, and associated methods to provide balanced distortion in a musical instrument and to emulate the sound of a tube amplifier when overdriven. Because this is done at low signal levels, the distorted sound can be created at lower volume levels than what is normally required to saturate a tube power amplifier.

Components utilized in the Figures are itemized in Table 1.

TABLE 1

| | Components |
|---|---|
| 10 | input |
| 12 | U1 amplifier with balanced output |
| 14 | positive path input |
| 16 | C2 capacitor |
| 18 | R3 resistor |
| 20 | inverter input positive path |
| 22 | R4 resistor |
| 24 | U3 CMOS inverter |
| 26 | inverter output positive path |
| 28 | negative path input |
| 30 | C1 capacitor |
| 32 | R1 resistor |
| 34 | inverter input negative path |
| 36 | U2 CMOS inverter |
| 38 | R2 resistor |
| 40 | inverter output negative path |
| 42 | U4 amplifier with differential input |
| 44 | output |
| 46 | Q1 P channel MOSFET |
| 48 | Vsupply |
| 50 | diode |
| 52 | ground |
| 54 | Q2 N channel MOSFET |
| 56 | Q3 P channel MOSFET |
| 58 | Vsupply |
| 60 | diode |
| 62 | ground |
| 64 | Q4 N channel MOSFET |

Figure 1:
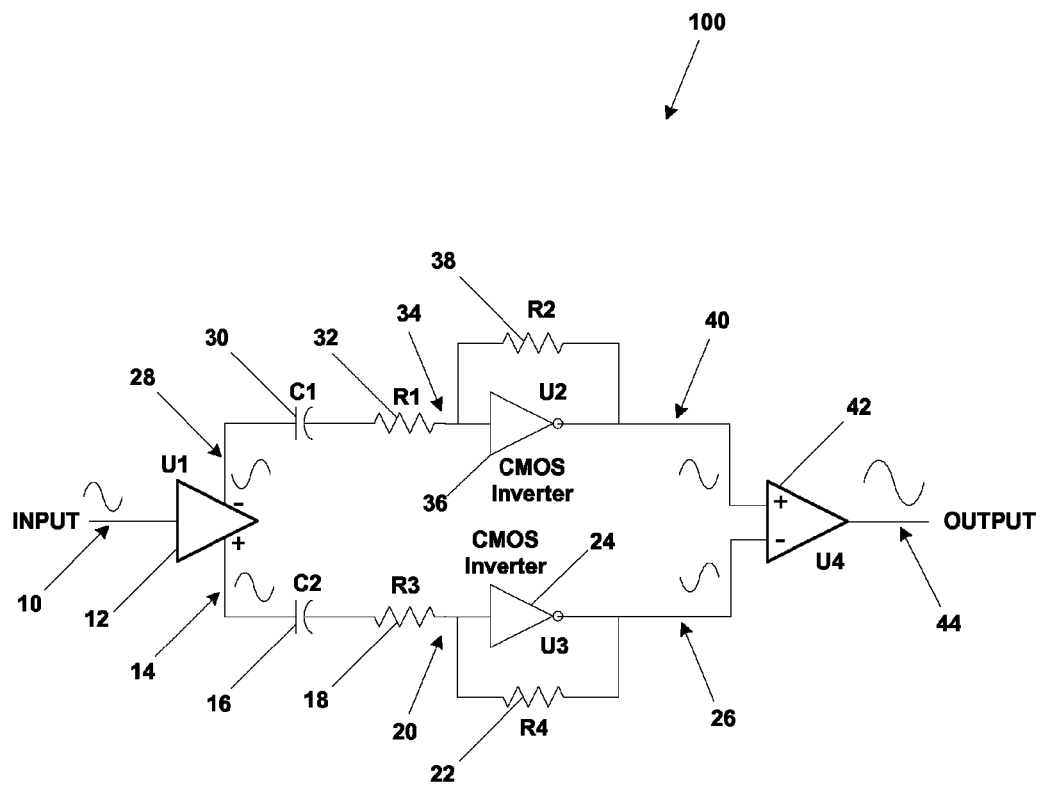
FIG. 1 is a schematic diagram of a circuit topology adapted to provide balanced distortion in a musical instrument, illustrating, in particular, an inverting signal path, a non-inverting signal path, and balanced CMOS inverters, according to an embodiment of the technology described herein.
Figure 2:
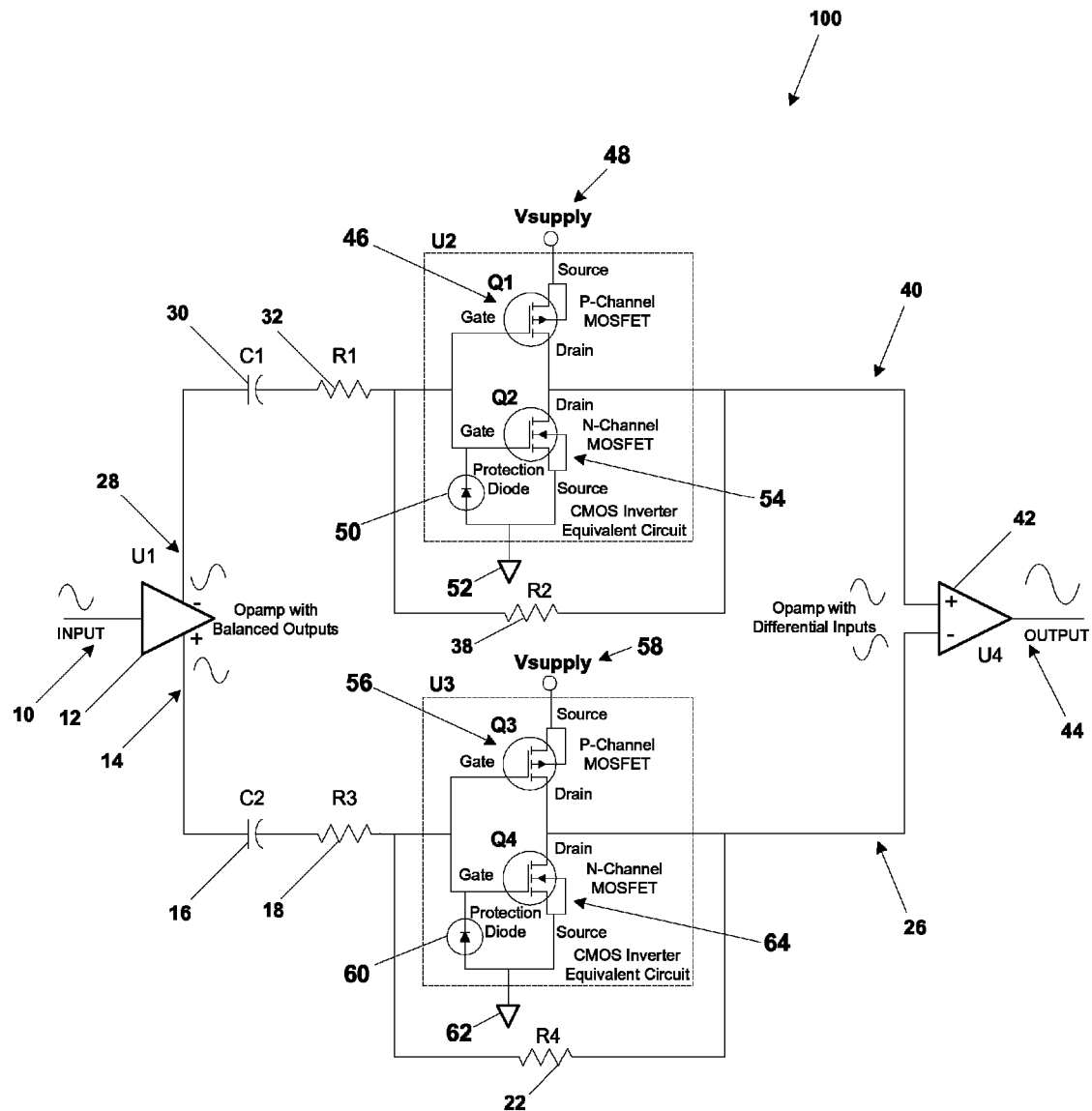
FIG. 2 is an expanded schematic diagram of the circuit topology for balanced distortion in a musical instrument depicted in FIG. 1, illustrating, in particular, the discrete components (MOSFETs) representative of the CMOS inverters, according to an embodiment of the technology described herein.

Referring now to FIGS. 1 through 2, an audio distortion circuit 100 is shown. Graphs featuring characteristics and outputs gained through utilization of the audio distortion circuit 100 are shown in FIGS. 3 through 10. FIGS. 11 through 16 illustrate alternative embodiments of the audio distortion circuit, 200, 300, 400, 500, 600, and 700, respectively.

As depicted in FIG. 1, the circuit topology 100 is shown. There are two signal paths. The input 10 passes through U1 Amplifier with Balanced Outputs 12 and splits into two paths, a non-inverting path and an inverting path. The non-inverting input is shown in FIG. 1 as Positive Path Input 14. The inverting input is shown in FIG. 1 as the Negative Path Input 28.

The inverting input, Negative Path Input 28, then passes through C1 Capacitor 30 and R1 Resistor 32 to arrive at the Inverter Input Negative Path 34. The negative signal path then passes through U2 CMOS Inverter 36 and R2 Resistor 38. This signal then enters the input of U4 Amplifier with Differential Input 42.

For the other parallel path, the non-inverting input, Positive Path Input 14, then passes through C2 Capacitor 16 and R3 Resistor 18 to arrive at the Inverter Input Positive Path 20. The positive signal path then passes through U3 CMOS inverter 24 and R4 Resistor 22. This signal then enters the input of U4 Amplifier with Differential Input 42.

These two signal paths 40, 26 are then combined in U4 Amplifier with Differential Input 42 to produce an Output 44.

As depicted in FIG. 2, a more detailed view of the circuit topology 100 is shown. The inverters can be viewed as discrete components and, in fact, can be constructed from discrete components. In that case, the U3 CMOS Inverter 24 in FIG. 1 can be made from discrete components illustrated in FIG. 2. These include Q3 56, Q4 64, and Diode 60 as depicted. Also, the U2 CMOS Inverter 36 in FIG. 1 can also be made from discrete components illustrated in FIG. 2. These include Q1 46, Q2 54, and Diode 50 as depicted.

U1 Amplifier with Balanced Output 12 can be constructed with opamps. All that is required is that the amplifier remains linear and produces two outputs, one inverting and one non-inverting. There are single IC solutions known in the art to create this function.

U4 Amplifier with Differential Input 42 is an opamp subtractor circuit. All that is required is that the amplifier remains linear and produces an output equal to the difference of its two inputs. There are single IC solutions known in the art to create this function.

Figure 3:
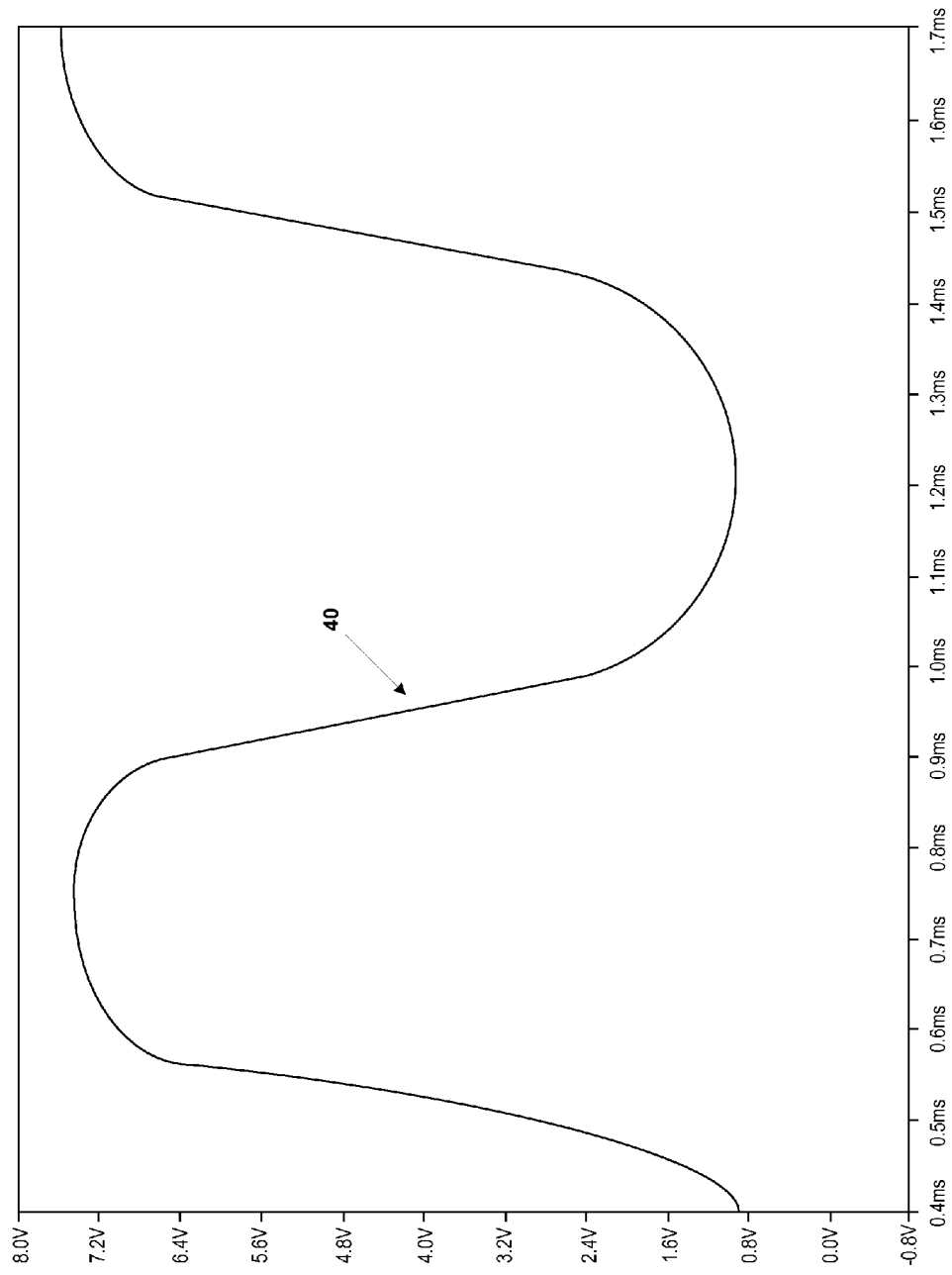
FIG. 3 is a graph illustrating a time domain representation of the output of a single inverter with a sinusoidal input and illustrating, in particular, an unbalanced waveform.

The circuit topology 100 cancels asymmetry in the output. FIG. 3 shows a time domain representation of the output of a single inverter with a sinusoidal input. It is noted that the output waveform is asymmetric, wherein the positive side of the waveform is not the same as the negative side. The inverter does not transition into saturation on the negative side at the same rate that it transitions into saturation on the positive side. This asymmetry causes a DC component in the waveform. When two different tones are played simultaneously, the waveform will have an envelope that will modulate with the difference in their frequency. Because of this, the DC component will also be modulated with this frequency difference and the beat note will be output as a signal directly. An objective of this audio circuit topology 100 implementation is to cancel this beat note modulation.

Figure 4:
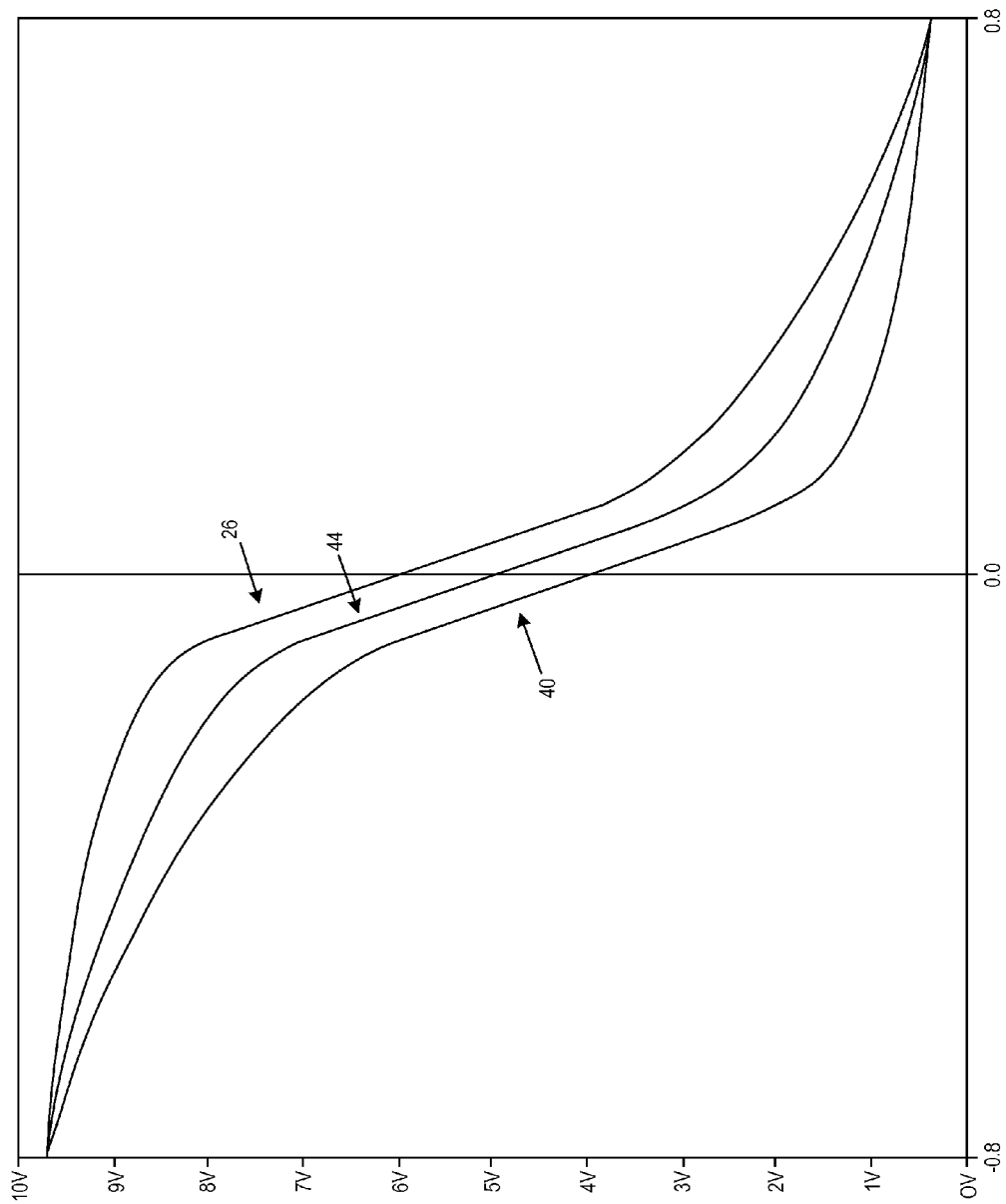
FIG. 4 is a graph illustrating the transfer characteristic of one side of the circuit topology.

FIG. 4 item 40 shows the transfer characteristic of one side of the topology. The bottom axis is the input voltage and the vertical axis is the output voltage of an inverter. Notice the asymmetry in the characteristic. Because the inverters are from a common IC package, all inverters in the package should have the same exact characteristic. FIG. 4 item 26 shows the characteristic of the inverted parallel path. When these two transfer characteristics are averaged together, the result is FIG. 4 item 44, where the result is perfectly symmetric. Inverting the transfer characteristic is mathematically equivalent to inverting the signal, going through the inverter and then inverting the output of the inverter and then summing the signals. The advantage with this latter method is that the two inverters only have to match and do not have to match the negative of the other's transfer characteristic. Inverters on a common substrate, manufactured at the same time are usually extremely well matched. This means the overall circuit will have a very high degree of symmetry. The numbers on FIGS. 3 and 4 can also be referenced back to FIG. 1 for their location in a typical circuit.

For the discrete device implementation as in FIG. 2, other prior art requires complementary matching of components which is considerably more difficult to obtain. The prior art requires MOSFETs in which the P channel device's transfer characteristic has to be exactly equal and opposite to that of the N channel device. For the topology disclosed herein, the P channel device has to match the other P channel device, and the N channel device has to match the other N channel device, but the P channel device does not have to match the opposite of the N channel device. This is an improvement to the prior art.

The feedback resistors establish the gain of the circuit for the CMOS inverter topology when it is connected as a linear amplifier. In FIG. 1, the gain of the circuit around U2 CMOS Inverter 36 is set by the ratio of R2/R1. This is known as negative, shunt feedback. For the CMOS inverter, the bias settles at approximately half the supply voltage. The AC coupling capacitors C1 item 30 and C2 item 16 allow this bias to settle at this point at 34 and 20. This establishes the quiescent operating point for both inverters. A reference to this can be found in "Linear Operation of the MOSFET Complementary Pair", F. C. Fitchen and V. G. Ellerbruch, IEEE journal of Solid-State Circuits, December 1971 and in the Fairchild Semiconductor application note AN-88 "CMOS Linear Applications", 1973.

Figure 5:
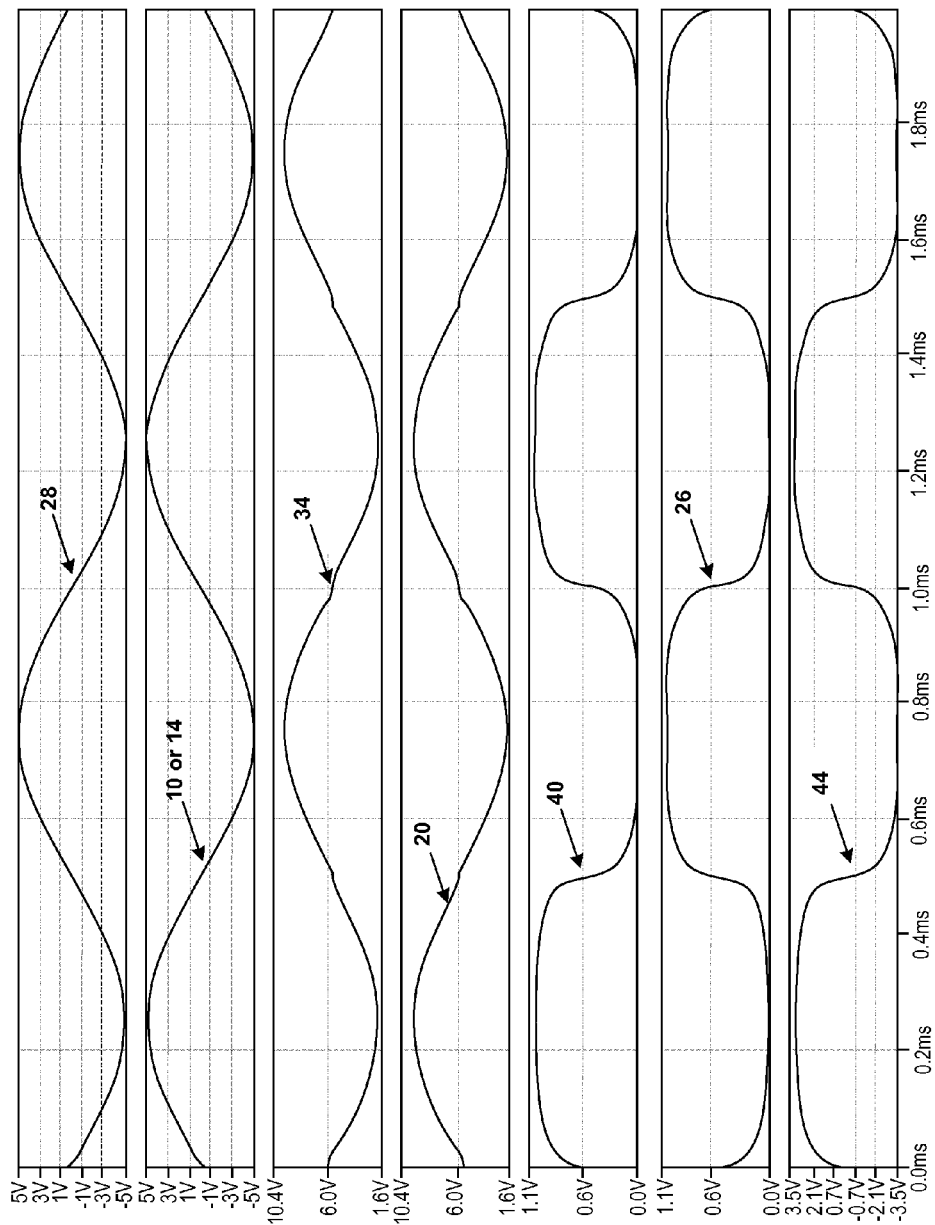
FIG. 5 is a graph illustrating the time domain waveforms through the circuit with a 12V power supply and a 0.5V signal.
Figure 6:
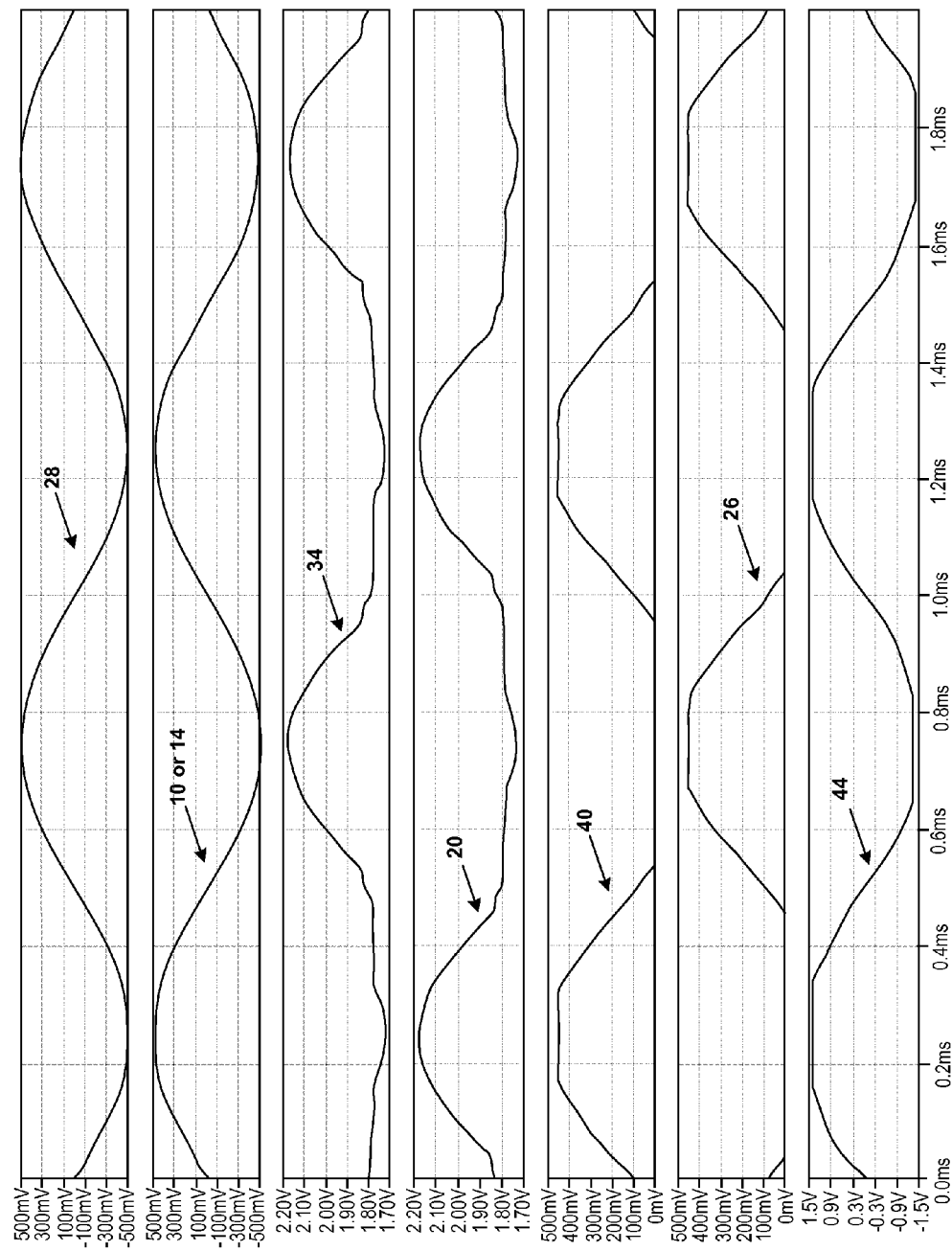
FIG. 6 is a graph illustrating the time domain waveforms through the circuit with a 5V power supply and a 0.05V signal.
Figure 7:
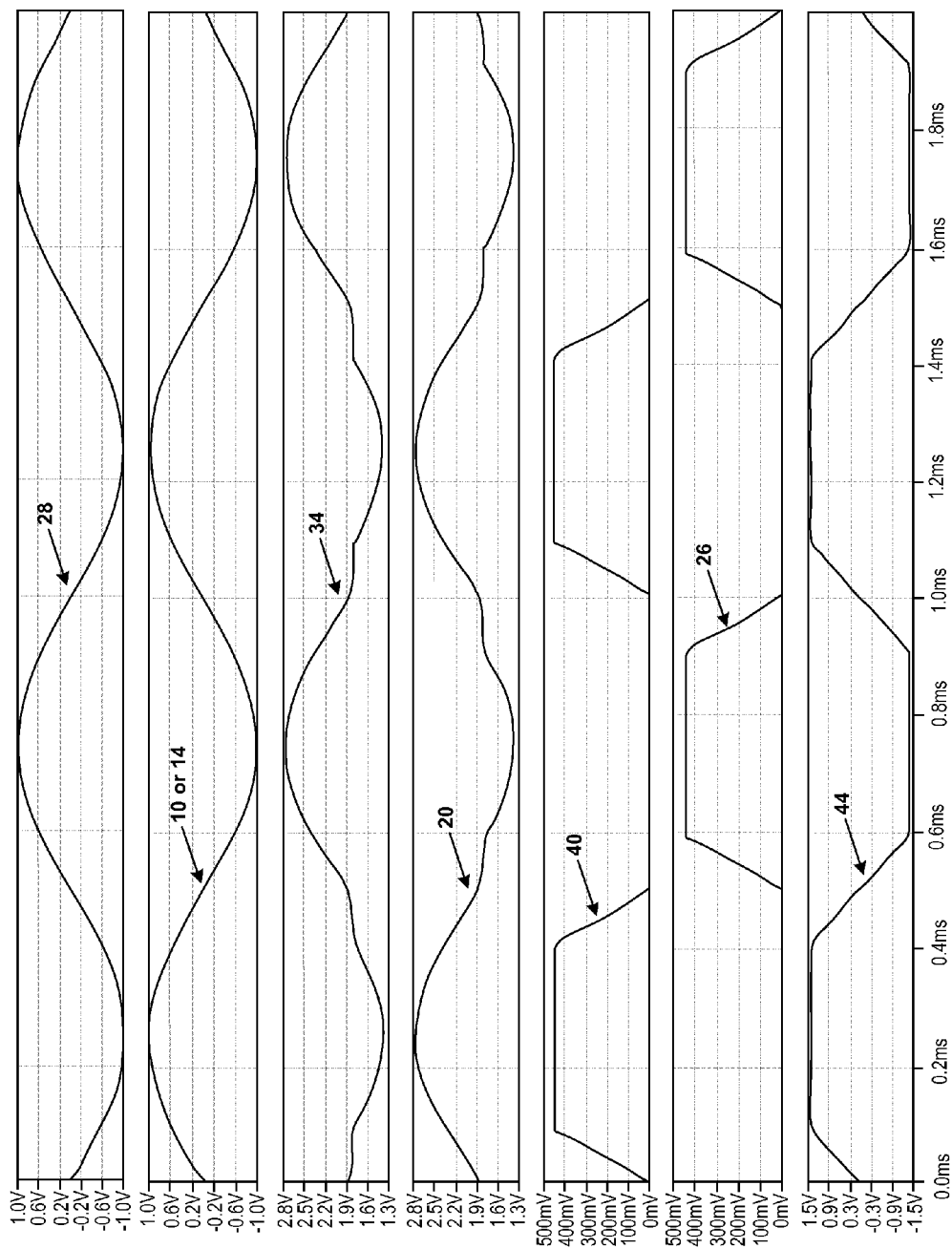
FIG. 7 is a graph illustrating the time domain waveforms through the circuit with a 5V power supply and a 0.1V signal.

FIG. 5 shows the time domain waveforms through the circuit. FIG. 5 item 10 is the Input. Note the sinusoidal waveform. 28 and 14 are the outputs of U1 Amplifier with Balanced Outputs 12. Waveforms 34 and 20 are the inputs to the inverters. 40 and 26 are the outputs of the inverters. Note the asymmetry in these waveforms. 44 is the final output. Note the symmetry produced in 44 by subtracting 40 and 26. Notice that the output waveform is a "fattened" sinusoid that produces harmonics similar to a tube amplifier. The waveform is "fattened" without producing asymmetry.

Figure 9:
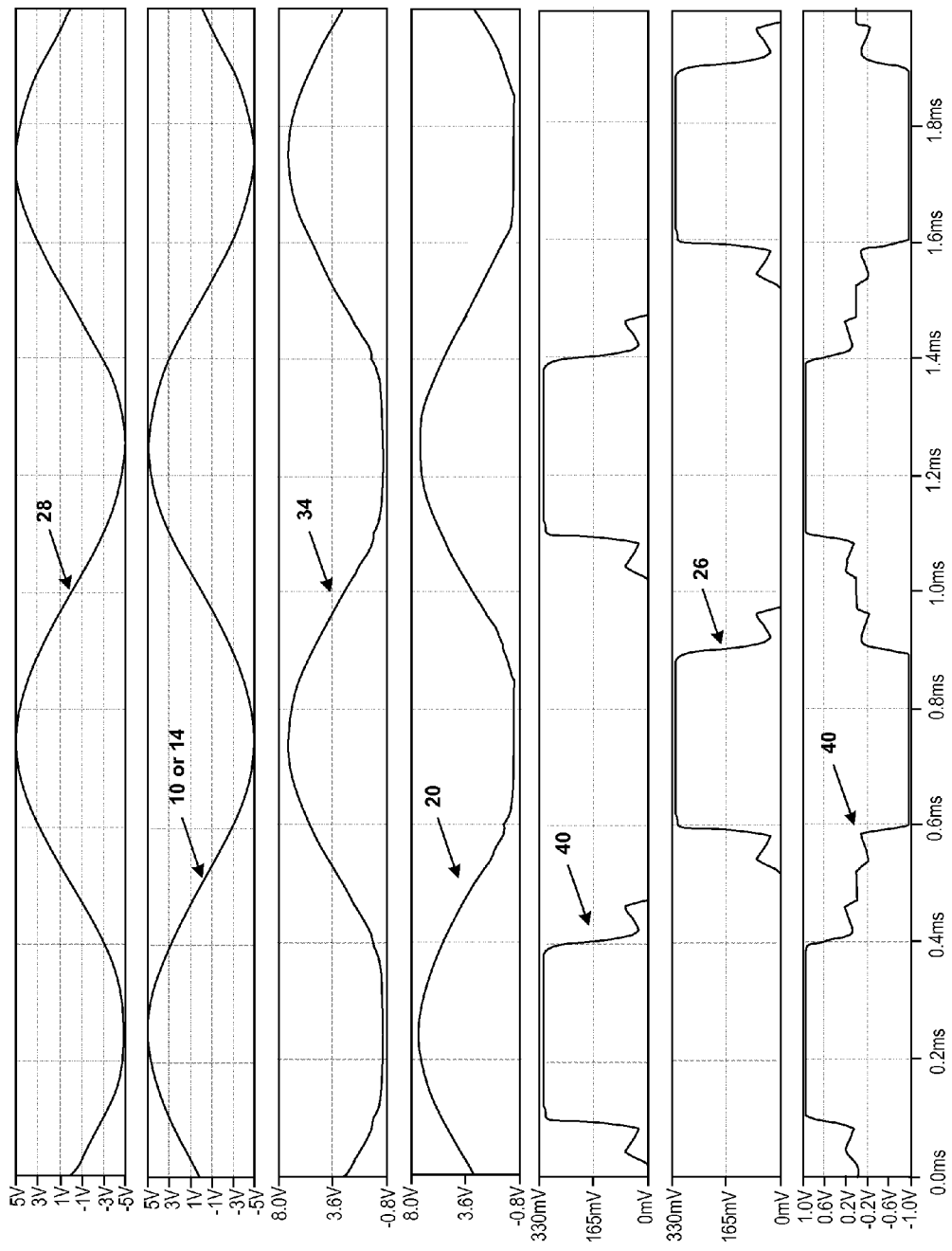
FIG. 9 is a graph illustrating the time domain waveforms through the circuit with a 3.5V power supply and a 0.5V signal.
Figure 10:
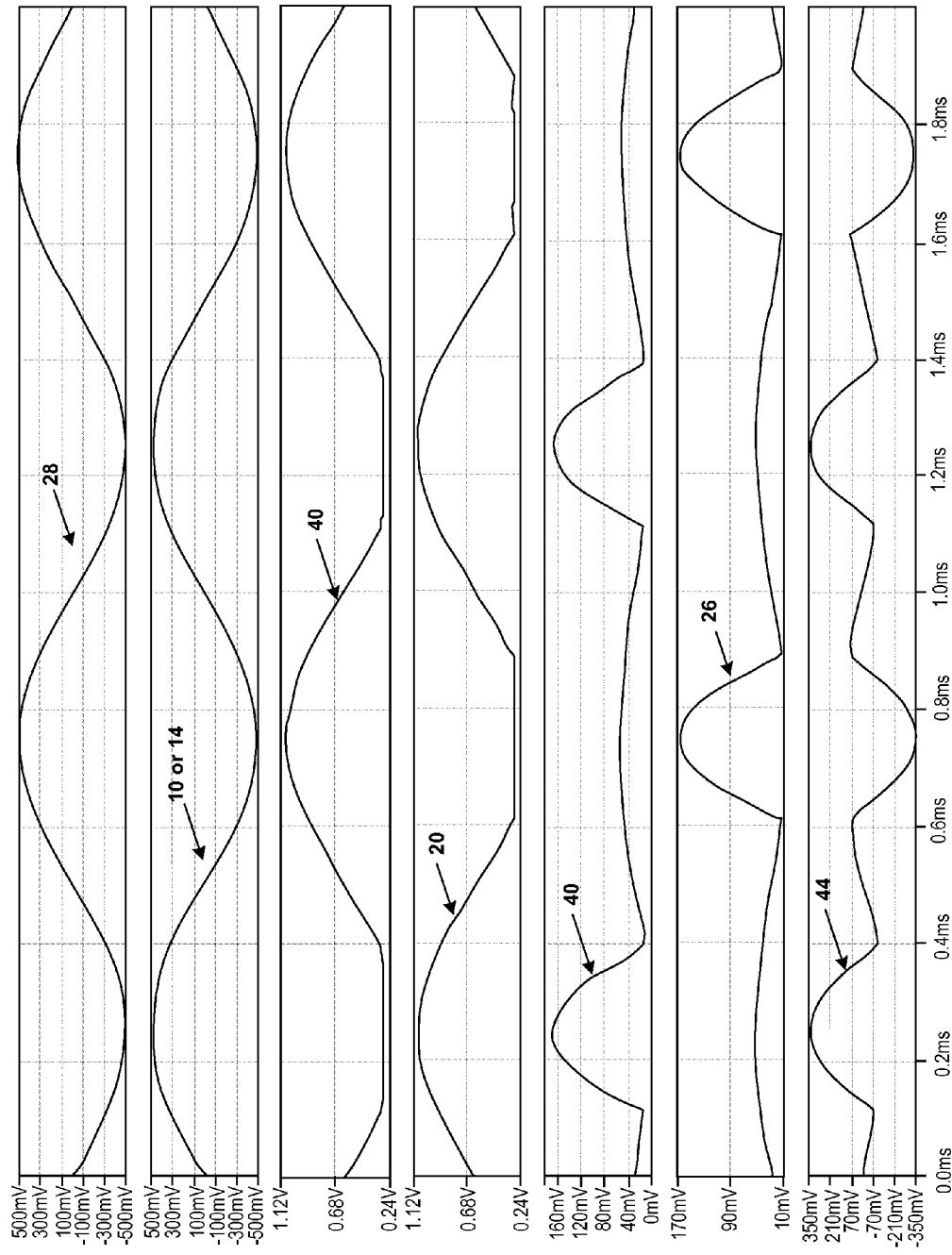
FIG. 10 is a graph illustrating the time domain waveforms through the circuit with a 3.5V power supply and a 0.05V signal.
Figure 11:
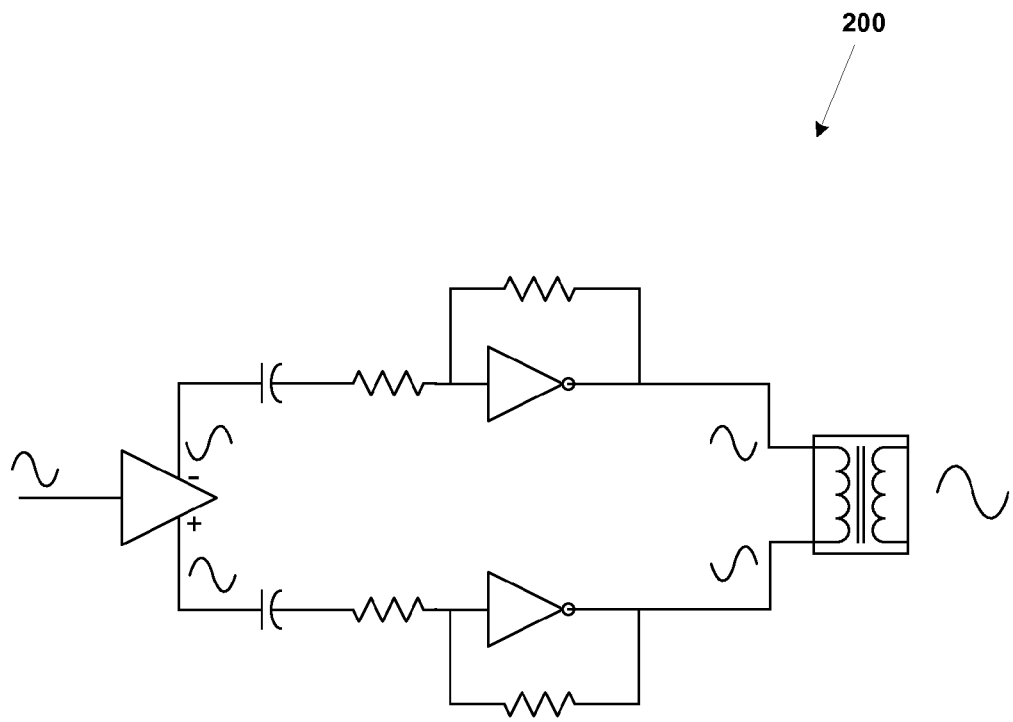
FIG. 11 is a schematic diagram of a circuit topology adapted to provide balanced distortion in a musical instrument, according to an alternative embodiment of the technology described herein.

For variation in tonal characteristics, the Vsupply FIG. 2 items 48 and 58 can be varied. The MOSFETs have a transfer characteristic that changes with the power supply. This variation occurs because the threshold voltage for the MOSFET occurs at a fixed level so that this threshold voltage becomes a larger portion of the Vsupply as Vsupply is decreased. FIG. 9 and FIG. 10 are both examples when the Vsupply is lowered to 3.5V for standard CMOS inverters. While the waveforms 44 in this case are symmetric, they contain a different, and in some cases, higher harmonic content than the "fattened" signal of FIG. 5. The end result is that higher voltages on the inverter supply, Vsupply, tend to produce a smoother overdrive type of sound while lower voltages for Vsupply tend to produce more harmonics and produce a distortion with more of an "edge." Also, one supply can be varied while the other one remains fixed to allow for degrees of balance.

Figure 8:
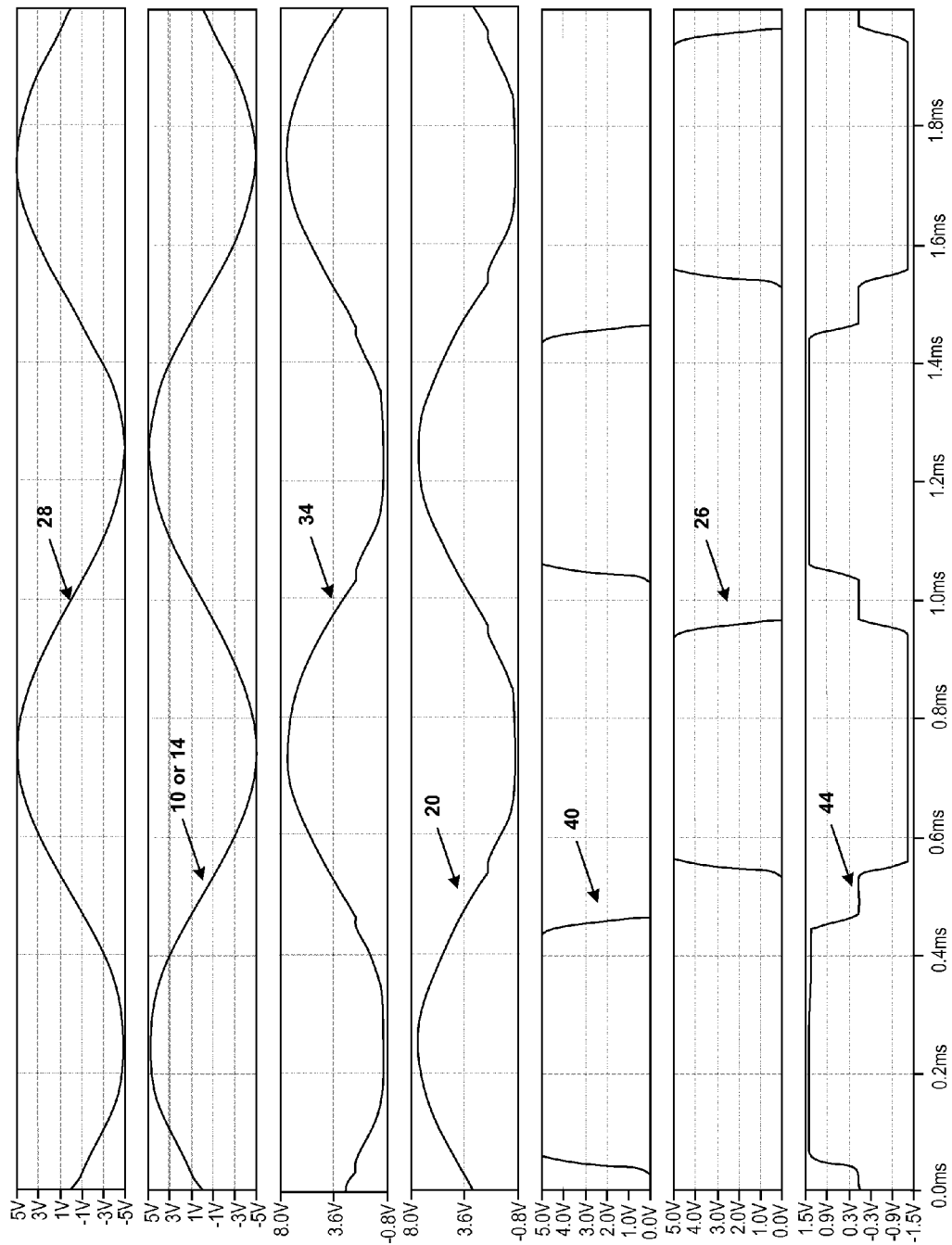
FIG. 8 is a graph illustrating the time domain waveforms through the circuit with a 5V power supply and a 0.5V signal.

There are also protection diodes that are included in a CMOS inverter. These diodes create an effect as well. Refer to FIG. 8 for the following discussion. If the input waveform peak value exceeds the bias of one half the supply voltage, the diodes at the input to the inverter will clamp this waveform at approximately zero volts minus a diode voltage drop. This shifts the bias up for the waveform at the input to the inverters. This can be seen in FIG. 8 waveforms 34 and 20. This causes the waveforms to not turn on for a full half-cycle. This can be seen in FIG. 8 waveforms 40 and 26. This point where both inverter outputs are at the same voltage causes the final output to be zero volts and creates a type of cross-over distortion that is typical of tube amps being overdriven. This can be seen in FIG. 8 waveform 44. This cross-over distortion is dependant on intensity of playing. This only occurs at higher playing intensities. This adds another playing dimension to playing dynamics. Usually playing dynamics are lost in a heavily saturated device. If the technology disclosed herein is implemented with discrete devices, the diodes can be switched in or out of the circuit to give a variation in tonality.

Because the overall transfer characteristic is extremely symmetric, as the signal is increased into the circuit, the distortion will grow in a very musical manner. Because of the inherent device symmetry, the signal is symmetric at all signal levels. The signal has none of the DC beat notes, no matter what the playing intensity level. Because of this, the instrumentalist has the ability to increase or decrease the level of distortion by their playing dynamics. This makes the device very touch sensitive which is a very desirable characteristic to instrumentalists. This can be seen in FIGS. 6, 7, and 8. In each case the input signal grows in intensity relative to the Vsupply. Waveform 44 in each figure progresses from barely distorted, to clipped triangular, to almost square with cross-over distortion.

FIGS. 11 through 16 illustrate alternative embodiments of the audio distortion circuit, with circuits 200, 300, 400, 500, 600, and 700, respectively.

In one alternative embodiment, a transformer output can be utilized in place of the power amp. In place of the FIG. 1 item 42 U4 Amplifier with Differential Input a transformer can be utilized to perform the difference. This allows for the circuit to be used to generate higher power output signals to make a solid-state power amp that simulates tube distortion.

In another alternative embodiment, multiple inverters are utilized per side, with feedback local to each. For this implementation, several inverters are used on each side with a local resistive divider establishing the feedback at each inverter. AC coupling can or cannot be used between inverters.

In another alternative embodiment, multiple inverters are utilized per side, with an odd number of inverters per side, with feedback around all inverters on a side. For this implementation, an odd number of inverters is used on each side with a single resistive divider on each side establishing the overall gain. The feedback resistor is placed from the last inverter on a side to the input of the first inverter on the same side.

In another alternative embodiment, multiple inverters are utilized per side, with an even number of inverters per side, with cross-coupled feedback. For this combination there would be an even number of inverters on each side with the feedback resistors cross-coupled from the output of the last inverter to the input of the first inverter on the opposing side.

In another alternative embodiment, the Vsupply and ground connections are changed. In this case the Vsupply would only have to be at a higher potential than the ground side. For this, one could use +V and −V in place of the Vsupply and Ground.

In another alternative embodiment, resistors can be added between the Vsupply and the inverter power and between the inverter ground and the chassis ground.

In another alternative embodiment, variable filters can be added to change the frequency response of the feedback paths.

Figure 12:
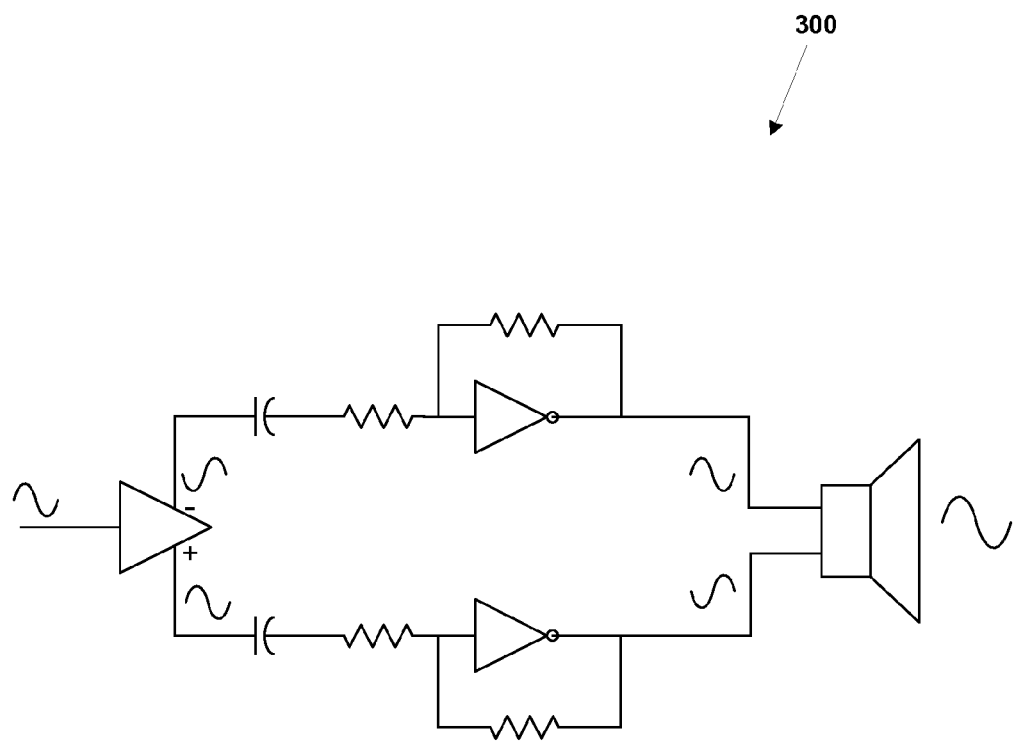
FIG. 12 is a schematic diagram of a circuit topology adapted to provide balanced distortion in a musical instrument, according to an alternative embodiment of the technology described herein.
Figure 13:
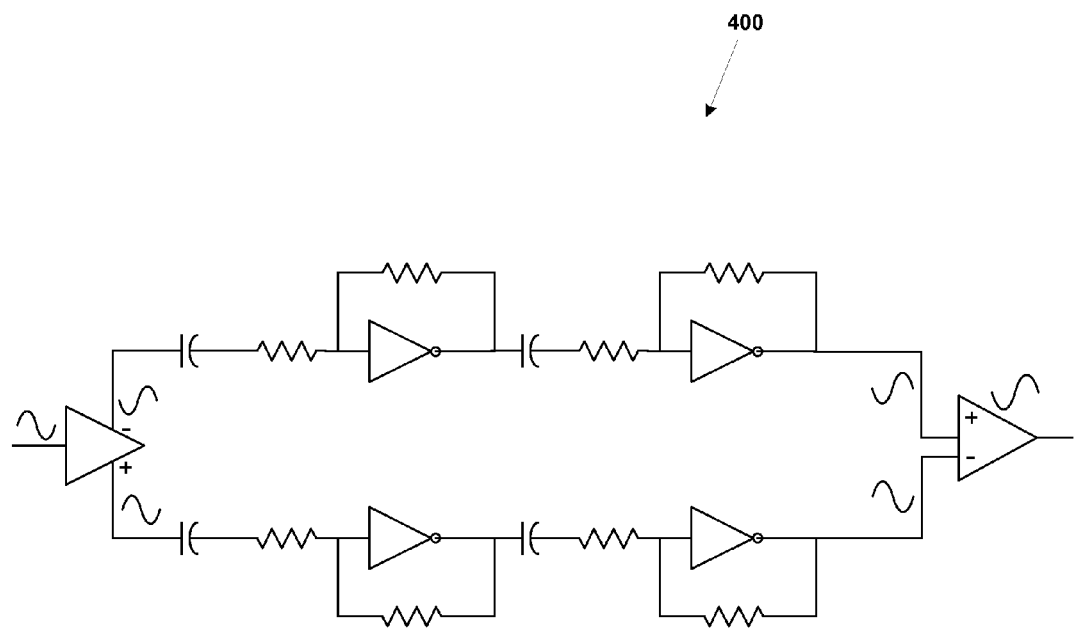
FIG. 13 is a schematic diagram of a circuit topology adapted to provide balanced distortion in a musical instrument, according to an alternative embodiment of the technology described herein.
Figure 14:
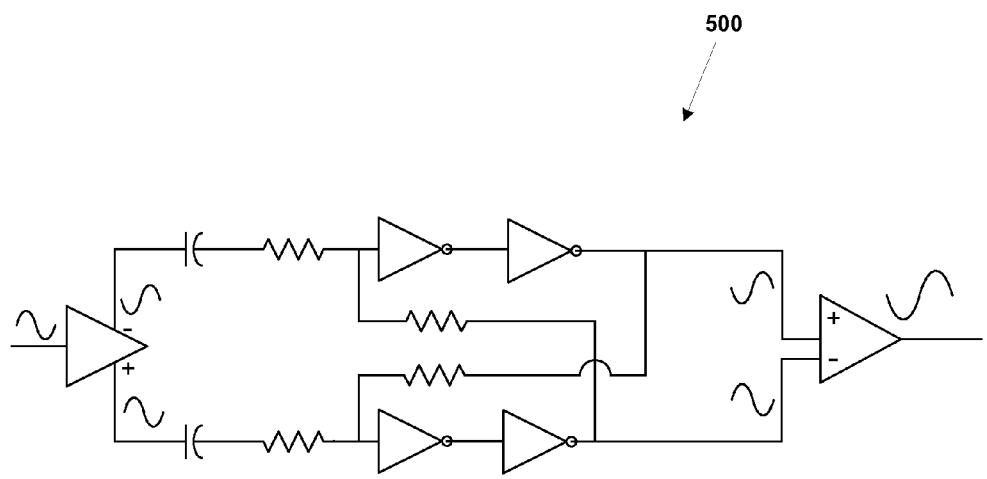
FIG. 14 is a schematic diagram of a circuit topology adapted to provide balanced distortion in a musical instrument, according to an alternative embodiment of the technology described herein.
Figure 15:
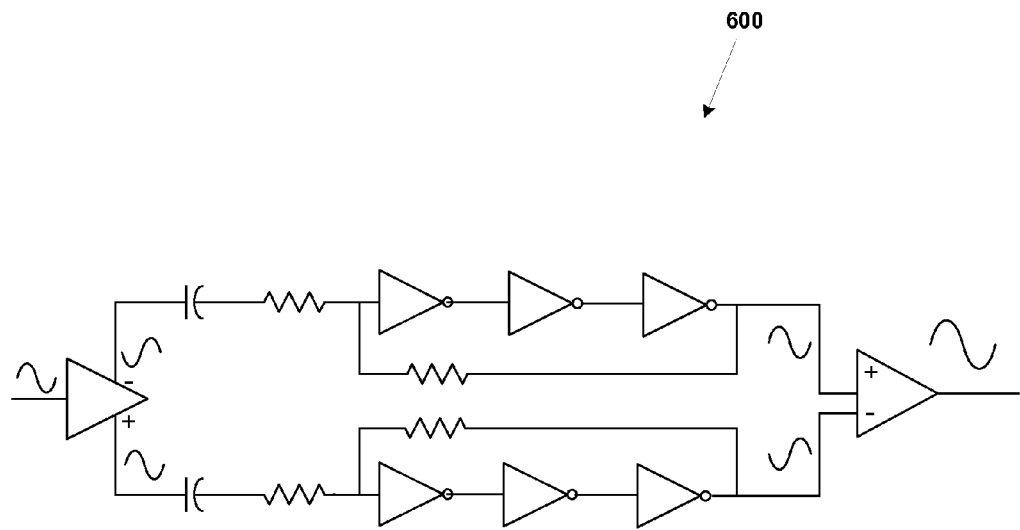
FIG. 15 is a schematic diagram of a circuit topology adapted to provide balanced distortion in a musical instrument, according to an alternative embodiment of the technology described herein.
Figure 16:
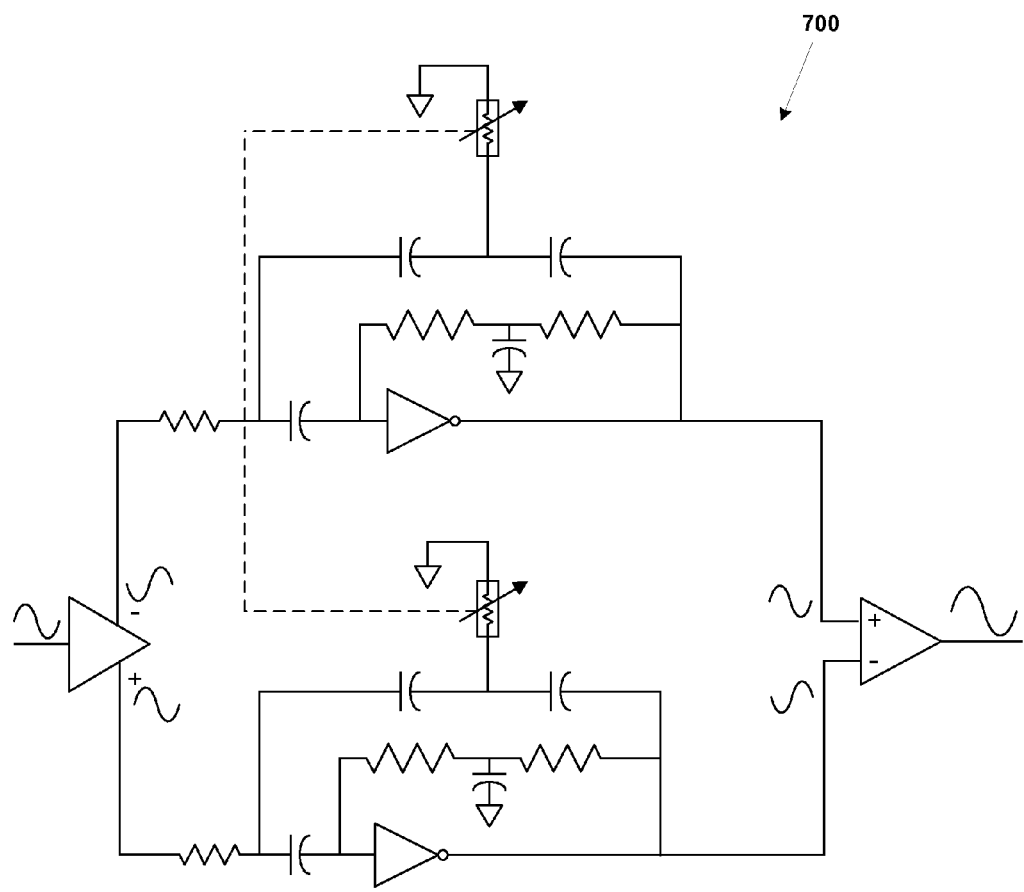
FIG. 16 is a schematic diagram of a circuit topology adapted to provide balanced distortion in a musical instrument, according to an alternative embodiment of the technology described herein.

In another alternative embodiment, a balanced drive into speaker is provided. Specifically, and as depicted in FIG. 12, the speaker itself is used for high power combining of two balanced CMOS power amps in a common output.

The above mentioned alternative embodiments can be implemented based on a balanced CMOS topology.

Although this technology has been illustrated and described herein with reference to preferred embodiments and specific examples thereof, it will be readily apparent to those of ordinary skill in the art that other embodiments and examples can perform similar functions and/or achieve like results. All such equivalent embodiments and examples are within the spirit and scope of the invention and are intended to be covered by the following claims.

What is claimed is:

1. An audio distortion circuit to provide balanced distortion in a musical instrument and to emulate the sound of a tube amplifier when overdriven, the audio distortion circuit comprising:
   an input stage adapted to receive an input audio signal, remain linear, and maintain balanced outputs that are opposite in polarity, and adapted to split the input audio signal into two parallel signal paths, an inverting, negative path and a non-inverting, positive path;
   an inverting, negative path balanced distortion circuit following the inverting, negative path and adapted to receive an inverting, negative path input, wherein an output negative path exited from the inverting, negative path balanced distortion circuit comprises a first full waveform;
   a non-inverting, positive path balanced distortion circuit following the non-inverting, positive path, and parallel to the inverting, negative path balanced distortion circuit, and adapted to receive a non-inverting, positive path input, wherein an output positive path exited from the non-inverting, positive path balanced distortion circuit comprises a second full waveform; and
   an output stage following the inverting, negative path balanced distortion circuit and the non-inverting, positive path balanced distortion circuit, wherein the output stage is adapted to combine a pair of differential inputs, one the output negative path exited from the inverting, negative path balanced distortion circuit, the first full waveform, and two the output positive path exited from the non-inverting, positive path balanced distortion circuit, the second full waveform, and to subtract the two paths to produce an output audio signal;
   wherein the audio distortion circuit is adapted to cancel incoming asymmetries in the output stage from the combined pair of differential inputs and produce the output audio signal as symmetric; and
   wherein the audio distortion circuit is adapted to distort, clip, and limit, selectively by a user, the input audio signal.

2. The audio distortion circuit of claim 1, wherein the input stage comprises an amplifier with balanced outputs that are opposite in polarity.

3. The audio distortion circuit of claim 1, wherein the input stage comprises a transformer with balanced outputs.

4. The audio distortion circuit of claim 1, wherein the inverting, negative path balanced distortion circuit and the non-inverting, positive path balanced distortion circuit each comprises a CMOS inverter with an internal input protection diode.

5. The audio distortion circuit of claim 1, wherein the inverting, negative path balanced distortion circuit and the non-inverting, positive path balanced distortion circuit each comprises a plurality of discrete components each adapted to emulate a CMOS inverter, and wherein each plurality of discrete components comprises a P channel MOSFET and an N channel MOSFET.

6. The audio distortion circuit of claim 5, wherein the plurality of discrete components further comprise a diode in each of the inverting, negative path balanced distortion circuit and the non-inverting, positive path balanced distortion circuit, and wherein the diode is adapted to be switched selectively into the circuit or switched selectively out of the circuit to provide a variation in tone.

7. The audio distortion circuit of claim 5, wherein a transfer characteristic of the P channel MOSFET is not required to be exactly equal and opposite, complimentarily matched, to a transfer characteristic of the N channel MOSFET.

8. The audio distortion circuit of claim 5, further comprising:
   at least one first resistor placed between a first Vsupply and a power to the inverting, negative path balanced distortion circuit; and
   at least one second resistor placed between a second Vsupply and a power to the non-inverting, positive path balanced distortion circuit;
   wherein the resistors are adapted to linearize a response.

9. The audio distortion circuit of claim 1, wherein the output stage comprises an amplifier with differential input.

10. The audio distortion circuit of claim 9, wherein the amplifier with differential input comprises an opamp subtractor circuit that is adapted to remain linear and to produce an output equal to a difference of its two inputs.

11. The audio distortion circuit of claim 1, wherein the output stage comprises a transformer, and wherein the audio distortion circuit is thereby adapted to generate higher power output signals to make a solid-state power amplifier that simulates tube distortion.

12. The audio distortion circuit of claim 1, further comprising:
   a plurality of inverters on the inverting, negative path;
   a plurality of inverters on the non-inverting, positive path;
   wherein the plurality of inverters on the inverting, negative path and the plurality of inverters on the non-inverting, positive path are a same quantity; and
   a plurality of local resistive dividers, a local resistive divider adapted to establish a feedback at each inverter;
   wherein AC coupling selectively is established between the inverters.

13. The audio distortion circuit of claim 1, further comprising:
   a plurality of inverters on the inverting, negative path, the plurality being an odd number;

a plurality of inverters on the non-inverting, positive path, the plurality being an odd number;

wherein the plurality of inverters on the inverting, negative path and the plurality of inverters on the non-inverting, positive path are a same quantity;

a first local resistive divider on the inverting, negative path, wherein the first local resistive divider is adapted to provide feedback around all of the plurality of inverters on the inverting, negative path; and a second local resistive divider on the non-inverting, positive path, wherein the second local resistive divider is adapted to provide feedback around all of the plurality of inverters on the non-inverting, positive path.

14. The audio distortion circuit of claim 1, further comprising:

a plurality of inverters on the inverting, negative path, the plurality being an even number;

a plurality of inverters on the non-inverting, positive path, the plurality being an even number;

a first feedback resistor, the first feedback resistor cross-coupled from an output of the last inverter of the plurality of inverters on the inverting, negative path to an input of a first inverter on the non-inverting, positive path; and a second feedback resistor, the second feedback resistor cross-coupled from an output of the last inverter of the plurality of inverters on the non-inverting, positive path to an input of a first inverter on the inverting, negative path;

wherein the plurality of inverters on the inverting, negative path and the plurality of inverters on the non-inverting, positive path are a same quantity; and wherein the first feedback resistor and the second feedback resistor are adapted to provide cross-coupled feedback.

15. The audio distortion circuit of claim 1, further comprising:

an at least one first variable filter placed in a first feedback path on the non-inverting, positive path; and an at least one second variable filter placed in a second feedback path on the inverting, negative path;

wherein the variable filters are adapted to change selectively the frequency response of the feedback paths.

16. The audio distortion circuit of claim 1, wherein the output stage comprises a balanced drive into a speaker, and wherein the speaker is adapted for a high power combination of two balanced CMOS power amplifiers in a common output.

17. An audio distortion circuit to provide balanced distortion in a musical instrument and to emulate the sound of a tube amplifier when overdriven, the audio distortion circuit comprising:

an input stage amplifier, with balanced outputs that are opposite in polarity, adapted to receive an input audio signal, remain linear, and maintain balanced outputs, and adapted to split the input audio signal into two parallel signal paths, an inverting, negative path and a non-inverting, positive path;

an inverting, negative path balanced distortion circuit, comprising a first P channel MOSFET, a first N channel MOSFET, and a first diode, and following the inverting, negative path and adapted to receive an inverting, negative path input, wherein an output negative path exited from the inverting, negative path balanced distortion circuit comprises a first full waveform;

a non-inverting, positive path balanced distortion circuit, comprising a second P channel MOSFET, a second N channel MOSFET, and a second diode, following the non-inverting, positive path, and parallel to the inverting, negative path balanced distortion circuit, and adapted to receive a non-inverting, positive path input, wherein an output positive path exited from the non-inverting, positive path balanced distortion circuit comprises a second full waveform;

wherein the first diode and the second diode each is adapted to be switched selectively into the circuit or switched selectively out of the circuit to provide a variation in tone;

wherein a transfer characteristic of each of the P channel MOSFETs is not required to be exactly equal and opposite, complimentarily matched, to a transfer characteristic of the N channel MOSFET;

an output stage amplifier with differential input following the inverting, negative path balanced distortion circuit and the non-inverting, positive path balanced distortion circuit, wherein the output stage amplifier with differential input is adapted to combine a pair of differential inputs, one the output negative path exited from the inverting, negative path balanced distortion circuit, the first full waveform, and two the output positive path exited from the non-inverting, positive path balanced distortion circuit, the second full waveform, to produce an output audio signal;

wherein the audio distortion circuit is adapted to cancel incoming asymmetries in the output stage amplifier with differential input from the combined pair of differential inputs and produce the output audio signal as symmetric; and wherein the audio distortion circuit is adapted to distort, clip, and limit, selectively by a user, the input audio signal.

18. A method to provide balanced distortion in a musical instrument and to emulate the sound of a tube amplifier when overdriven, the method comprising:

receiving an audio input signal at an input stage adapted to receive an input audio signal, while maintaining linearity and maintaining balanced outputs;

splitting the input audio signal into two parallel signal paths, an inverting, negative path and a non-inverting, positive path;

passing a first signal through an inverting, negative path balanced distortion circuit following the inverting, negative path and adapted to receive an inverting, negative path input, wherein an output negative path exited from the inverting, negative path balanced distortion circuit comprises a first full waveform;

passing a second signal through a non-inverting, positive path balanced distortion circuit following the non-inverting, positive path, and parallel to the inverting, negative path balanced distortion circuit, and adapted to receive a non-inverting, positive path input, wherein an output positive path exited from the non-inverting, positive path balanced distortion circuit comprises a second full waveform;

combining the first signal and the second signal in an output stage following the inverting, negative path balanced distortion circuit and the non-inverting, positive path balanced distortion circuit, wherein the output stage is adapted to combine a pair of differential inputs, one the output negative path exited from the inverting, negative path balanced distortion circuit, the first full waveform, and two the output positive path exited from the non-inverting, positive path balanced distortion circuit, the second full waveform, to produce an output audio signal;

canceling incoming asymmetries and beat note modulation in the output stage from the combined pair of differential inputs;

producing the output audio signal as symmetric; and distorting, clipping, and limiting, selectively by a user, the input audio signal.

19. The method of claim 18, further comprising:

utilizing an inverting, negative path balanced distortion circuit, comprising a first P channel MOSFET, a first N channel MOSFET, and a first diode, and following the inverting, negative path and adapted to receive an inverting, negative path input;

utilizing a non-inverting, positive path balanced distortion circuit, comprising a second P channel MOSFET, a second N channel MOSFET, and a second diode, following the non-inverting, positive path, and parallel to the inverting, negative path balanced distortion circuit, and adapted to receive a non-inverting, positive path input; and switching, selectively, the first diode and the second diode into the circuit and out of the circuit to provide a variation in tone;

wherein a transfer characteristic of each of the P channel MOSFETs is not required to be exactly equal and opposite, complimentarily matched, to a transfer characteristic of the N channel MOSFET.

20. The method of claim 18, further comprising:

varying a first Vsupply to the inverting, negative path balanced distortion circuit;

varying a second Vsupply to the non-inverting, positive path balanced distortion circuit; and producing, thereby, variation in tonal characteristics.

* * * * *